(12) United States Patent
Kadobe et al.

(10) Patent No.: US 12,398,830 B2
(45) Date of Patent: Aug. 26, 2025

(54) PIPING STRUCTURE AND PROCESSING APPARATUS

(71) Applicant: Tokyo Electron Limited, Tokyo (JP)

(72) Inventors: Masato Kadobe, Iwate (JP); Hiromi Nitadori, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 302 days.

(21) Appl. No.: 17/700,894

(22) Filed: Mar. 22, 2022

(65) Prior Publication Data

US 2022/0307627 A1   Sep. 29, 2022

(30) Foreign Application Priority Data

Mar. 25, 2021   (JP) .................... 2021-052327

(51) Int. Cl.
| | |
|---|---|
| C23C 16/44 | (2006.01) |
| F04B 37/14 | (2006.01) |
| F04B 39/12 | (2006.01) |
| F04B 41/06 | (2006.01) |
| F16L 9/19 | (2006.01) |
| H01L 21/67 | (2006.01) |

(52) U.S. Cl.
CPC ............ *F16L 9/20* (2013.01); *F04B 37/14* (2013.01); *F04B 39/123* (2013.01); *F04B 41/06* (2013.01)

(58) Field of Classification Search
CPC ....... F16L 9/20; F16L 9/19; F16L 9/22; F04B 41/06
See application file for complete search history.

(56) References Cited

U.S. PATENT DOCUMENTS

2023/0307253 A1*   9/2023   Bailey .............. H01L 21/67017

FOREIGN PATENT DOCUMENTS

| | | | |
|---|---|---|---|
| JP | 2019090482 A | * | 6/2019 |
| JP | 2020-113629 A | | 7/2020 |
| KR | 20200087766 A | | 7/2020 |
| WO | WO-2020214618 A1 | * | 10/2020 ....... H01L 21/67017 |

OTHER PUBLICATIONS

Endo, JP2019090482 and translation (Year: 2019).*

* cited by examiner

*Primary Examiner* — Steven S Anderson, II
(74) *Attorney, Agent, or Firm* — Venjuris, P.C.

(57) ABSTRACT

A piping structure includes a plurality of pipes that connects a plurality of process modules disposed adjacent to each other at a first room and a plurality of vacuum pumps disposed at a second room below the first room to be corresponding to the plurality of process modules, respectively. The plurality of pipes are divided into a plurality of blocks in a height direction, and the plurality of pipes used for blocks in an identical height have an identical shape.

11 Claims, 12 Drawing Sheets

PIPING STRUCTURE AND PROCESSING APPARATUS

CROSS-REFERENCE TO RELATED APPLICATION

This application is based on and claims priority from Japanese Patent Application No. 2021-052327 filed on Mar. 25, 2021 with the Japan Patent Office, the disclosure of which is incorporated herein in its entirety by reference.

TECHNICAL FIELD

The present disclosure relates to a piping structure and a processing apparatus.

BACKGROUND

In the related art, a processing apparatus has been known in which a processing unit that includes a plurality of process modules disposed adjacent to a first room and a loader module accommodating a carrier that is disposed in the first room and accommodates substrates to be processed by the plurality of process modules, and a plurality of pump units that is disposed corresponding to the plurality of process modules in a second room adjacent to the first room, respectively, are provided, and the length of a connecting pipe for connecting the corresponding plurality of process modules and the plurality of pump units is the same (see, e.g., Japanese Patent Laid-Open Publication No. 2020-113629).

SUMMARY

In order to achieve the above-described objective, a piping structure according to an embodiment of the present disclosure includes a plurality of pipes that connects a plurality of process modules disposed adjacent to each other at a first room and a plurality of vacuum pumps disposed at a second room below the first room to be corresponding to the plurality of process modules, respectively. The plurality of pipes are divided into a plurality of blocks in a height direction, and the plurality of pipes used for blocks in an identical height have an identical shape.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the accompanying drawings.

First Embodiment

Figure 1:
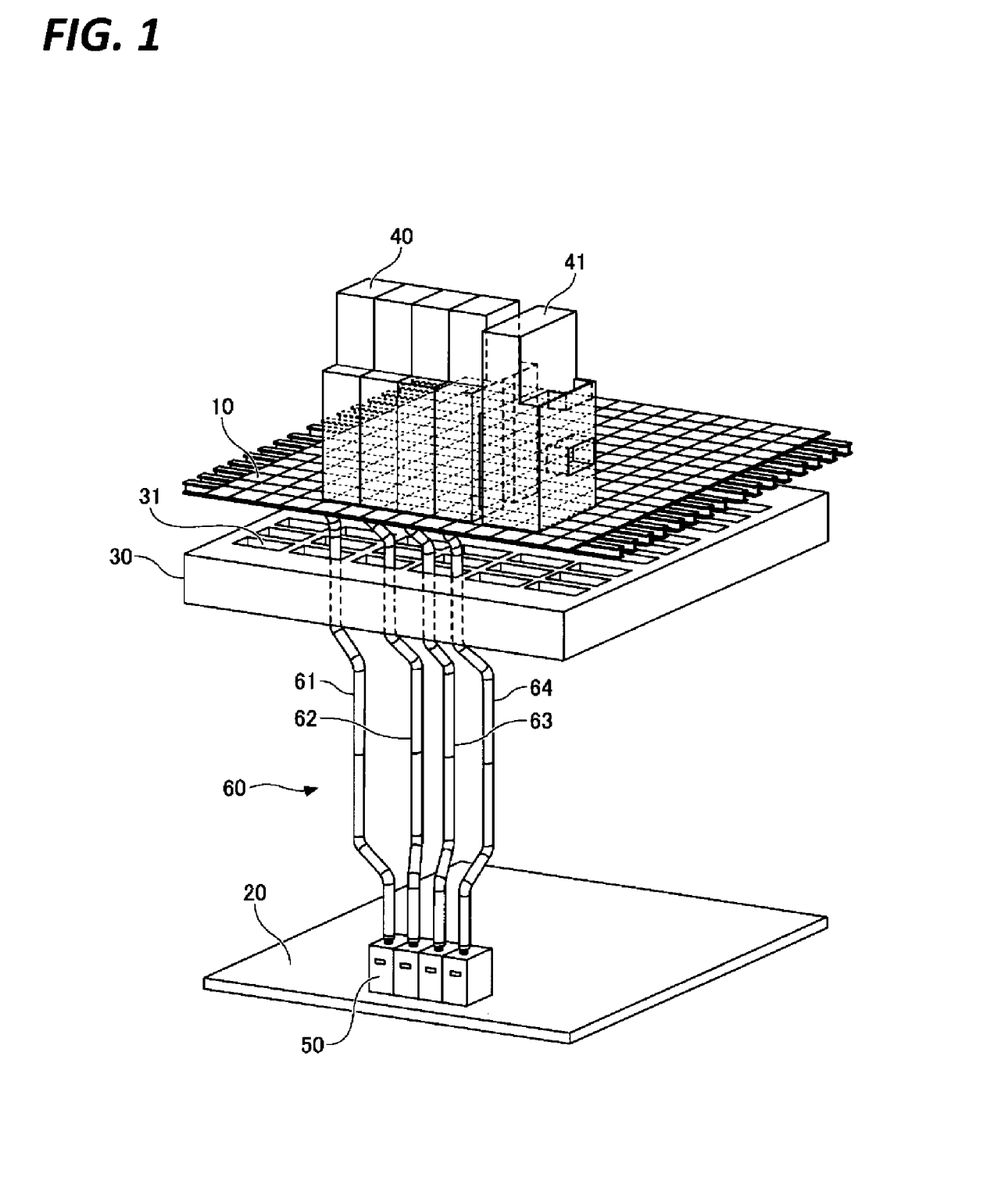
FIG. 1 is a view illustrating an example of the disposition of a processing apparatus according to a first embodiment of the present disclosure.

FIG. 1 is a view illustrating an example of the disposition of a processing apparatus according to a first embodiment of the present disclosure. The processing apparatus according to the present embodiment includes a process module 40, a vacuum pump 50, and a piping structure 60. The process module 40 is installed in the first room 10, and the vacuum pump 50 is installed in the second room 20 below the first room 10. A clean room facility structure 30 is provided between the first room 10 and the second room 20.

The process module 40 is a module for processing a substrate (not illustrated), and performs a process for processing such as a film formation, an annealing, or an etching, or a process for manufacturing on the substrate. A plurality of process modules 40 is provided in parallel to improve a processing efficiency. In FIG. 1, four process modules 40 are provided. In addition to the process modules 40, a loader 41 is provided to load the substrate into each process module 40. The process modules 40 may process various substrates depending on the usage, and descriptions will be made on an example of using a silicon wafer (hereinafter, referred to as a "wafer") as a substrate.

A module that performs various processes may be used as the process module 40, but in the present embodiment, descriptions will be made on the case where a vertical heat treatment apparatus is used as the process module. The process module 40 accommodates a substrate holder capable of loading a plurality of substrates. For example, each process module 40 is configured as a module capable of processing 50 to 200 substrates at a time. By disposing a plurality of such process modules 40 in parallel and executing processes at the same time, the number of processed substrates may be increased. Therefore, it is possible to dispose a plurality of process modules 40 adjacent to each other and perform a substrate process in parallel.

The loader 41 is a device for receiving and storing a plurality of FOUPs, and the productivity per unit area may be improved by associating one loader 41 with a plurality of process modules 40. Therefore, it is required that the plurality of process modules 40 are disposed adjacent to each other to have a small footprint as a whole as much as possible.

Since the process module 40 is a module for performing a vacuum process, it is required to connect a vacuum pump 50 to each process module 40 and evacuate the inside of the process module 40. Therefore, a one-to-one vacuum pump 50 is provided corresponding to each process module 40, and four vacuum pumps 50 are installed corresponding to four process modules 40.

The vacuum pump 50 is an exhaust unit for evacuating the processing chamber of the process module 40, and a vacuum pump 50 such as a dry pump, a turbo molecular pump, or a cryopump may be used according to a process.

As illustrated in FIG. 1, in many cases, the process module 40 may be installed in the first room 10, and the vacuum pump 50 may be installed in the second room 20 downstairs. In this case, pipes 61 to 64 are installed corresponding to the respective pairs of the process module 40 and the vacuum pump 50, and each process module 40 and each vacuum pump 50 are connected to each other. Therefore, in FIG. 1, four pipes 61 to 64 are provided corresponding to the process modules 40 and the vacuum pumps 50.

Here, when the process module 40 in the first room 10 and the vacuum pump 50 in the second room 20 downstairs are connected by a pipe 60, a clean room facility structure 30 may be provided between the first room 10 and the second room 20.

The clean room facility structure 30 is provided with openings 31, and it is necessary to install pipes 61 to 64 through the openings 31. That is, it is necessary to connect the process module 40 and the vacuum pump 50 with each other under the constraint condition of the position of the opening 31 of the clean room facility structure 30.

In FIG. 1, an example is given in which the vacuum pumps 50 are disposed adjacent to each other directly under the process module 40, but there may be a case where the vacuum pumps 50 are not necessarily disposed together due to restrictions such as columns and walls. In such a case, when the pipe easiest to use is selected and connected based on a disposition relationship between the process module 40 and the vacuum pump 50, the shape and length of the pipe differ for each process module 40, and due to the change in exhaust conditions, a situation may occur in which the uniformity of the film forming process and the etching process performed in each process module may not be maintained.

Therefore, in the piping structure according to the present embodiment, a configuration is adopted in which the shapes and lengths of the plurality of pipes 61 to 64 are unified so that the conductance in the plurality of pipes 61 to 64 is the same. Hereinafter, this point will be described in detail.

Figure 2:
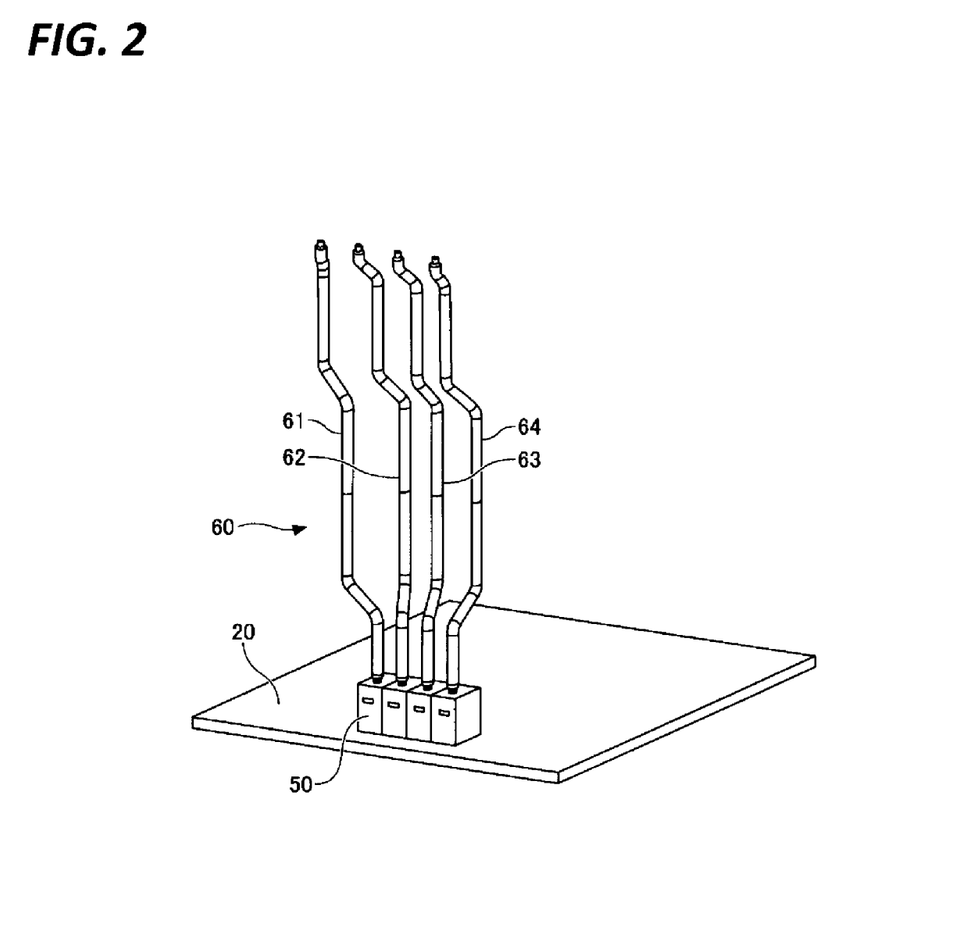
FIG. 2 is a perspective view illustrating an example of a piping structure according to the present embodiment.

FIG. 2 is a perspective view illustrating an example of the piping structure 60 according to the present embodiment. As illustrated in FIG. 2, the piping structure 60 includes four pipes 61 to 64, but the directions of the inclined portions of the pipes 61 to 64 are different from each other.

Figure 3:
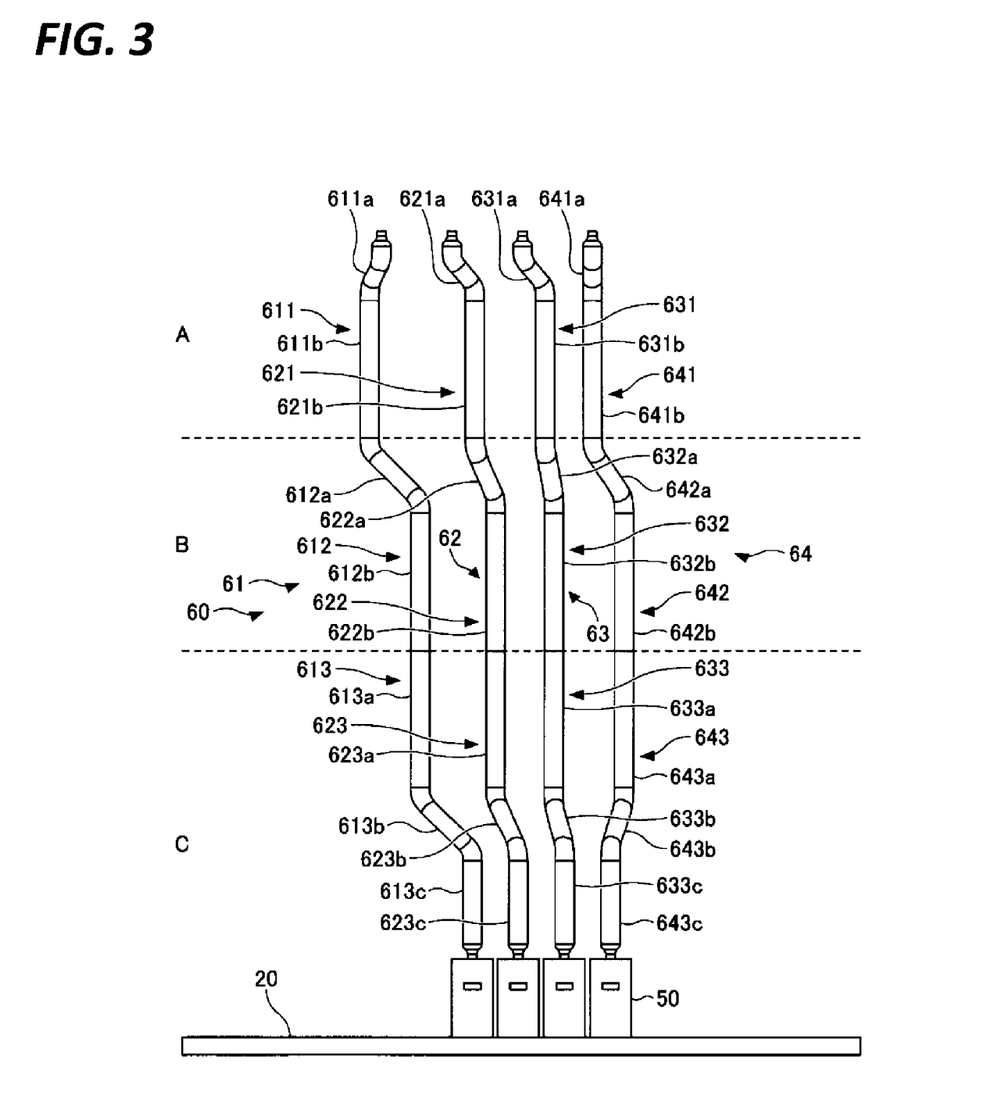
FIG. 3 is a front view of the piping structure according to the present embodiment.

FIG. 3 is a front view of the piping structure according to the present embodiment. As illustrated in FIG. 3, the piping structure 60 includes pipes 61 to 64, each of which is divided into three regions A to C in the height direction. The regions A to C are divided pipes of the pipes 61 to 64, respectively, and are cut portions connected by flanges. That is, the regions A to C are units that constitute a pipe as one component.

Focusing on the region A, the four pipes 61 to 64 have divided pipes 611 to 641, respectively. The divided pipes 611 to 641 are disposed in different directions, but all have the same shape. More specifically, the partial pipes 611 to 641 have inclined portions 611*a* to 641*a* and straight portions 611*b* to 641*b*, respectively, but the inclined portions 611*a* to 641*a* all have the same shape and the straight portions 611*b* to 641*b* also have the same shape.

Specifically, the inclined portions 611*a* to 641*a* are different in the inclination directions, the inclined portion 611*a* is slightly inclined to the right, the inclined portion 621*a* is slightly inclined to the left, the inclined portion 631*a* is inclined to the left at a slightly larger angle than the inclined portion 621*a*, and the inclined portion 641*a* is inclined to the front.

Meanwhile, the straight portions 611*b* to 641*b* all extend in the vertical direction and are differently disposed, but have the same shape.

Therefore, although the directions and positions of the partial pipes 611 to 641 are different from each other, the shapes thereof are all the same. When the partial pipes 611 to 641 have the same shape, since the conditions as a gas flow path are the same, the conductance thereof is the same.

Similarly, in the region B, the pipes 61 to 64 have partial pipes 612 to 642, respectively. The partial pipes 612 to 642 have inclined portions 612*a* to 642*a* and straight portions 612*b* to 642*b*, respectively. Also in the region B, the inclination directions of the inclined portions 612*a* to 642*a* are different from each other, the inclined portion 612*a* faces the left side, and the inclined portion 622*a* faces slightly to the left side. The inclined portion 632*a* faces the front, and the inclined portion 642*a* faces the left side at an angle smaller than the inclined portion 612*a* and larger than the inclined portion 622*a*. However, since the shapes of the inclined portions 612*a* to 642*a* are all the same, the conductance of the gas at the time of exhaust is the same.

Although the straight portions 612*b* to 642*b* are different in the disposed positions, the straight portions 612*b* to 642*b* all extend in the vertical direction and have the same length and thickness. Therefore, the conductance of the partial pipes 612 to 642 is the same.

Since the shapes of the inclined portions 612*a* to 642*a* are all the same and the shapes of the straight portions 612*b* to 642*b* are all the same, the conductance of the partial pipes 612 to 642 is also the same.

Regarding the region C, the partial pipes 613 to 643 have straight portions 613*a* to 643*a*, inclined portions 613*b* to 643*b*, and straight portions 613*c* to 643*c*, respectively. The partial pipes 611 to 641 and the partial pipes 612 to 642 in the regions A and B are respectively combinations of the inclined portions 611*a* to 641*a* and 612*a* to 642*a*, and the straight portions 611*b* to 641*b* and 612*b* to 642*b*, that is, a combination of one inclined portion and one straight portion. However, the partial pipes 613 to 643 are different from the partial pipes 611 to 641 and the partial pipes 612 to 642 in the regions A and B in that the partial pipes 613 to 643 are combinations of two straight portions 613*a* to 643*a* and 613*c* to 643*c* and one inclined portion 613*b* to 643*b*.

As described above, the combinations of the straight portions 613*a* to 643*a* and 613*c* to 643*c* and the inclined portions 613*b* to 643*b* in the partial pipes 613 to 643 may be variously prepared depending on the usage.

Also in the partial pipes 613 to 643, the shapes of the straight portions 613*a* to 643*a* are the same, the shapes of the inclined portions 613*b* to 643*b* are also the same, and the shapes of the straight portions 613c to 633c are also the same. Thus, the conductance of the partial pipes 613 to 641 is also the same.

Further, although the relative positions of the straight portions 613a to 643a and the inclination directions of the inclined portions 613b to 643b are different from each other, the positions of the straight portions 613c to 643d connected to the vacuum pump 50 with respect to the vacuum pump 50 are the same.

The piping structure 60 according to the present embodiment may start from the connection position of the process module 30 and may be set to a position suitable for the disposition of the vacuum pump 50 at the final arrival of the vacuum pump 50, and the intermediate routes may be disposed differently. Then, while passing through such different intermediate routes, the shapes in all the regions A to C may be made the same, and the conductance therein may be kept constant.

As described above, in all the regions A, B, and C in the height direction, the partial pipes 611 to 641, the partial pipes 612 to 642, and the partial pipes 613 to 643, respectively, have the same shape, so that the conductance of these partial pipes is the same. Therefore, the conductance of the pipes 61 to 64 is also the same. In the piping structure 60 according to the present embodiment, the conductance of the plurality of pipes 61 to 64 may be made the same while the passage routes and positions are made different from each other, and both the disposition with a high degree of freedom and the constant conductance may be achieved.

Figure 4:
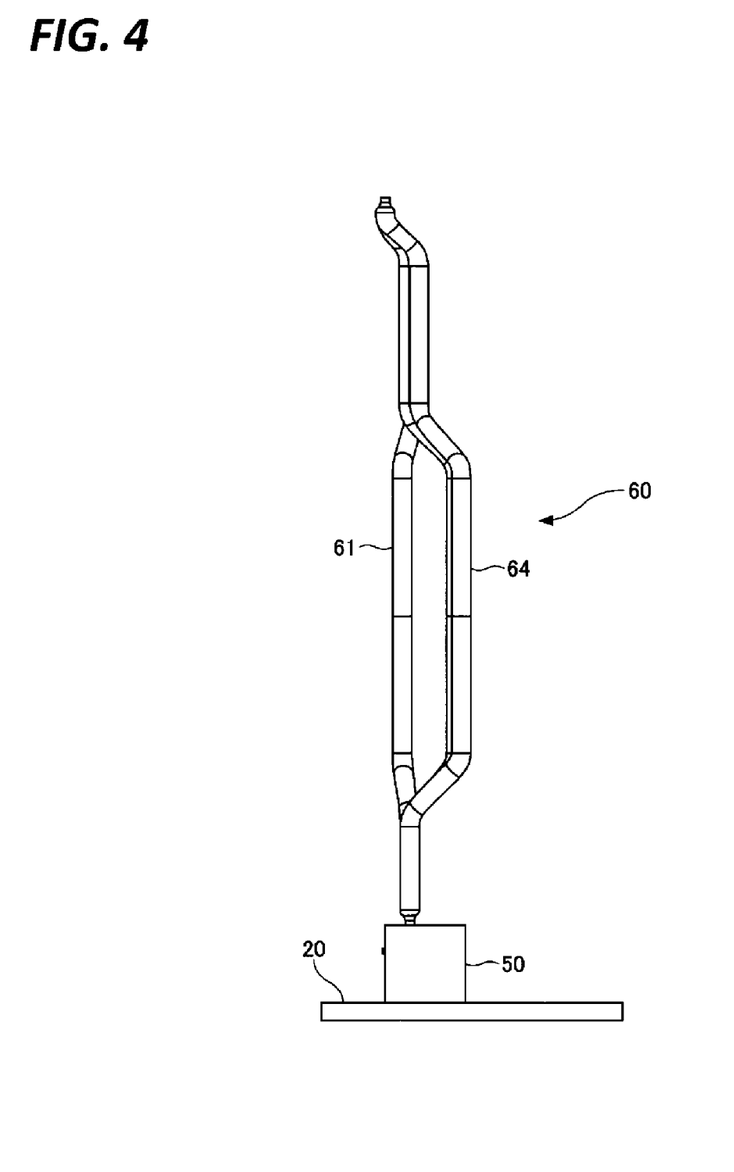
FIG. 4 is a side view of the piping structure according to the present embodiment.

FIG. 4 is a side view of the piping structure according to the present embodiment. As illustrated in FIG. 4, it may be seen that the pipes 61 to 64 of the piping structure 60 according to the present embodiment are configured to pass through various routes. This enables the disposition with a high degree of freedom.

Figure 5:
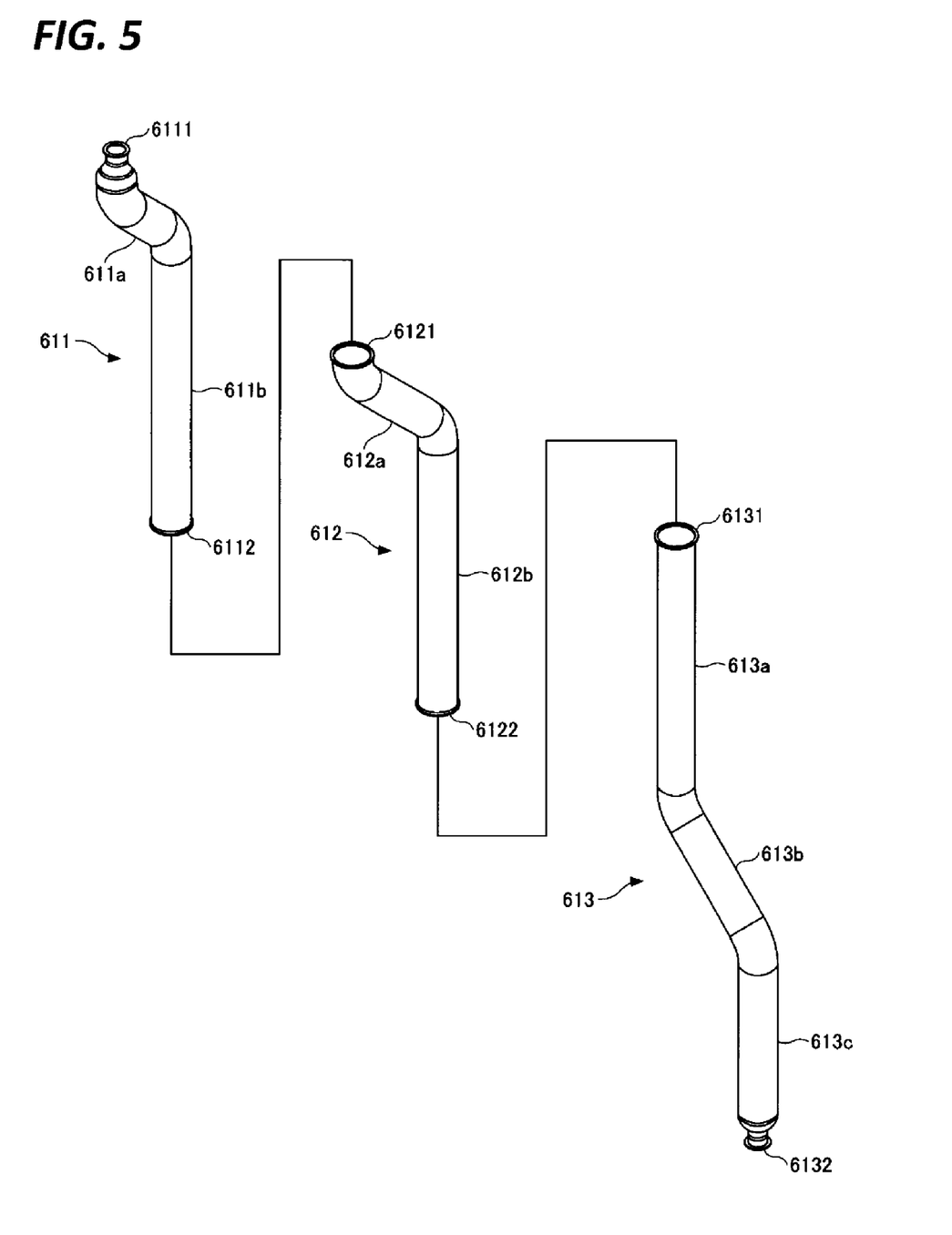
FIG. 5 is an exploded view illustrating one pipe of the piping structure according to the embodiment of the present disclosure in an exploded manner.

FIG. 5 is an exploded view illustrating one pipe of the piping structure according to the embodiment of the present disclosure in an exploded manner. In FIG. 5, the pipe 61 is given as an example, but the pipes 62 to 64 also have the same configuration.

In FIG. 5, the partial pipe 611 on the process module connection side is illustrated on the left, the partial pipe 613 on the vacuum pump connection side is illustrated on the right, and the partial pipe 612 in the middle is illustrated in the center.

The partial pipe 611 includes an inclined portion 611a and a straight portion 611b. A flange 6111 is provided at the uppermost part of the inclined portion 611a and a flange 6112 is provided at the lowermost part of the straight portion 611b. The flange 6111 connected to the process module 40 and the flange 6112 connected to the partial pipe 612 have different structures. In this way, as for the flanges 6111 and 6112, an appropriate type of flange may be used according to the object to be connected.

In this way, by combining the inclined portion 611a and the straight portion 611b, the position of the pipe may be shifted in the horizontal direction at the inclined portion 611a. Further, by providing the straight portion 611b, the conductance of the partial pipe 611 may be suppressed from decreasing. That is, the partial pipe 611 has a structure in which the position of the partial pipe 61 is shifted at the inclined portion 611a, and a straight pipe is used at a portion where the position does not need to be shifted to avoid an increase in conductance.

An inclination angle of the inclined portion 611a may be set in various ways depending on the usage, and may be, for example, 20 to 70 degrees, 30 to 60 degrees, or 45 degrees with respect to the vertical direction. In FIG. 5, an example is given in which the inclined portion 611a has an inclination angle of 45 degrees with respect to the vertical direction.

The partial pipe 612 in the middle also includes an inclined portion 612a and a straight portion 612b, and the position of the pipe 61 is shifted at the inclined portion 612a, and the other portions are made into straight lines which do not easily decrease the conductance.

Since the upper and lower ends of the partial pipe 612 are connected to the partial pipes 611 and 613, respectively, the same type of flanges 6121 and 6122 are used for the upper and lower ends.

The inclination angle of the inclined portion 612a is also set to, for example, 45 degrees. The point that the inclination angle may be changed according to the usage has been described with reference to the partial pipe 611.

The partial pipe 613 connected to the vacuum pump 50 includes a straight portion 613a, an inclined portion 613b, and a straight portion 613c. The straight portion 613c is connected to the vacuum pump 50 and configured as a straight portion to simplify the structure.

Although the inclined portion 613b and the straight portion 613a are different in the disposition order, the inclined portion 613b and the straight portion 613a have the same purpose as the inclined portions 611a and 612a and the straight portions 611b and 612b included in the partial pipes 611 and 612.

Further, since the upper end of the partial pipe 613 is connected to the lower end of the partial pipe 612 and the lower end thereof is connected to the vacuum pump 50, the flange 6131 provided at the upper end thereof and the flange 6132 provided at the lower end thereof have different configurations.

In this way, the pipe 61 is configured by connecting the partial pipes 611 to 613 in which the inclined portions 611a, 612a, and 613b and the straight portions 611b, 612b, 613a, and 613c are combined with each other. As a result, the pipe 61 may be configured into various shapes.

Further, since this configuration is the same for the other pipes 62 to 64, the conductance of the pipes 61 to 64 may be made the same, and various piping structures 60 may be provided according to the conditions of the clean room facility structure 30, columns, or walls while maintaining the conductance constant.

Figure 6:
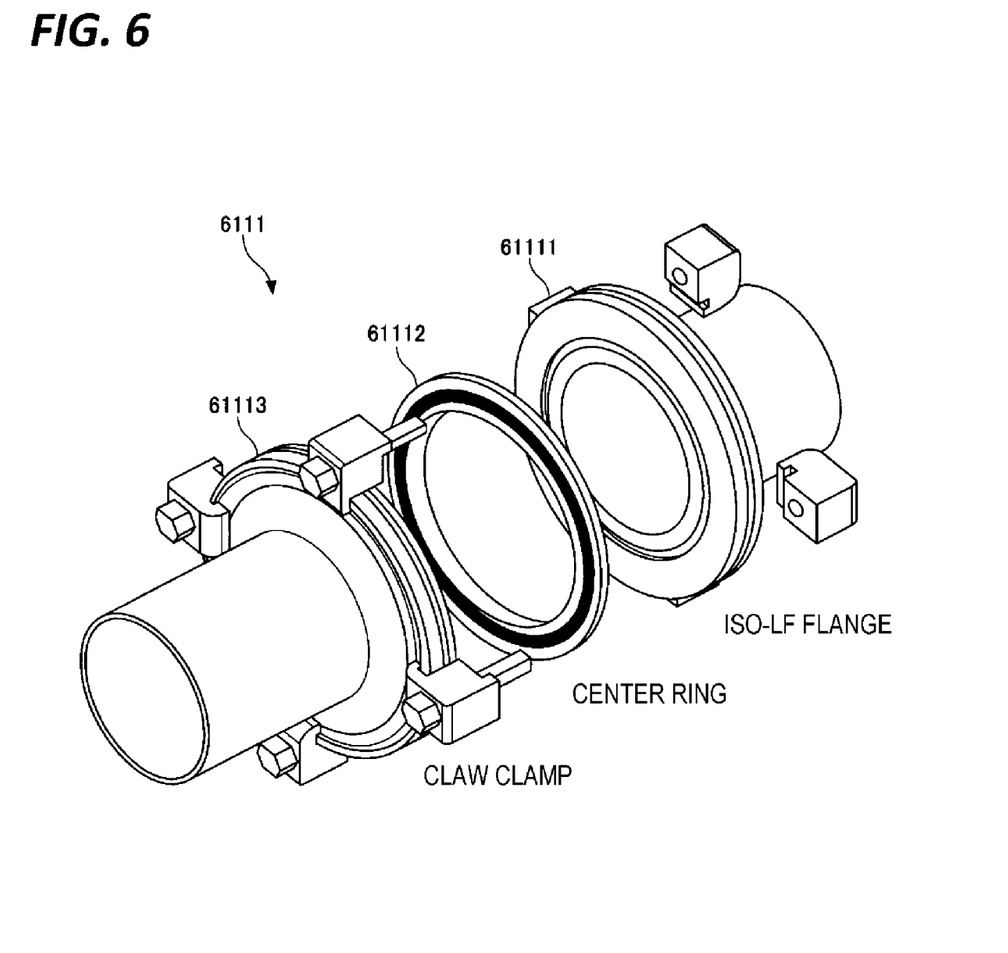
FIG. 6 is a view illustrating an example of the configuration of a flange.

FIG. 6 is a view illustrating an example of the configuration of the flange 6111. The flange 6111 includes a flange portion 61111, a center ring 61112, and a claw clamp 61113. The flange 6111 is configured to be able to rotate and connect the pipes due to a degree of freedom in the rotational direction with respect to the center of the pipe. In this way, it is possible to use the rotatable flange 6111 to connect the partial pipes 611 to 613 at various angles, thereby configuring the piping structure according to the present embodiment.

The structure of the flange 6132 may be the same as that of the flange 6111, and the flanges 6112, 6121, 6122, and 6131 may use rotatable flanges which are suitable for connecting pipes to each other.

Second Embodiment

Figure 7:
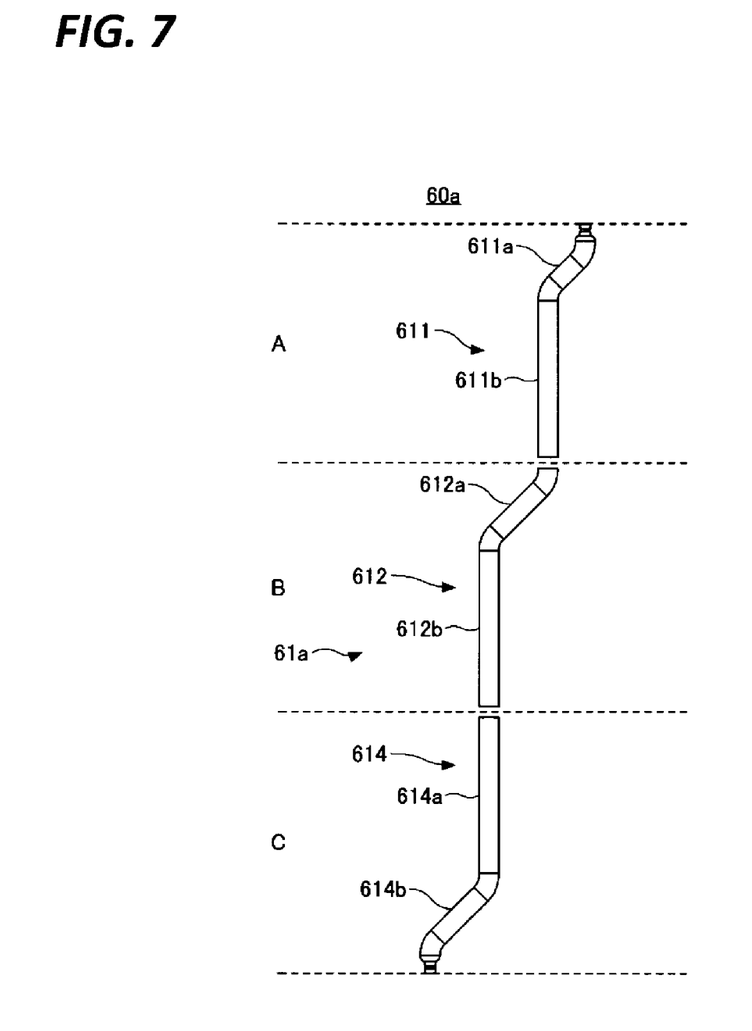
FIG. 7 is a view illustrating an example of partial pipes of a piping structure according to a second embodiment of the present disclosure.

FIG. 7 is a view illustrating an example of a partial pipe 61a of a piping structure 60a according to a second embodiment of the present disclosure. Regarding the partial pipes 611 and 612, the pipe 61a of the piping structure 60a according to the second embodiment has the same structure as the partial pipe 61 according to the first embodiment.

However, there is a difference in that the partial pipe 614 disposed in the pipe 61a of the piping structure 60a includes one straight portion 614a and one inclined portion 614b, whereas the partial pipe 613 disposed in the partial pipe 61 includes two straight portions and one inclined portion.

As described above, regarding all the partial pipes 611, 612, and 614, a structure may be prepared in which each of the straight portions 611b, 612b, and 614a and each of the inclined portions 611a, 612a, and 614b are provided. Even in this case, the positions of the inclined portions 611a, 612a, and 614b are shifted, and the number of the inclined portions 611a, 612a, and 614b is three in total, which does not change. Thus, the position of the pipe 61a may be changed in the same manner as the pipe 61 of the piping structure 60 according to the first embodiment. The other pipes 62 to 64 may also be the pipes 62a to 64a having the same configuration.

Figure 8:
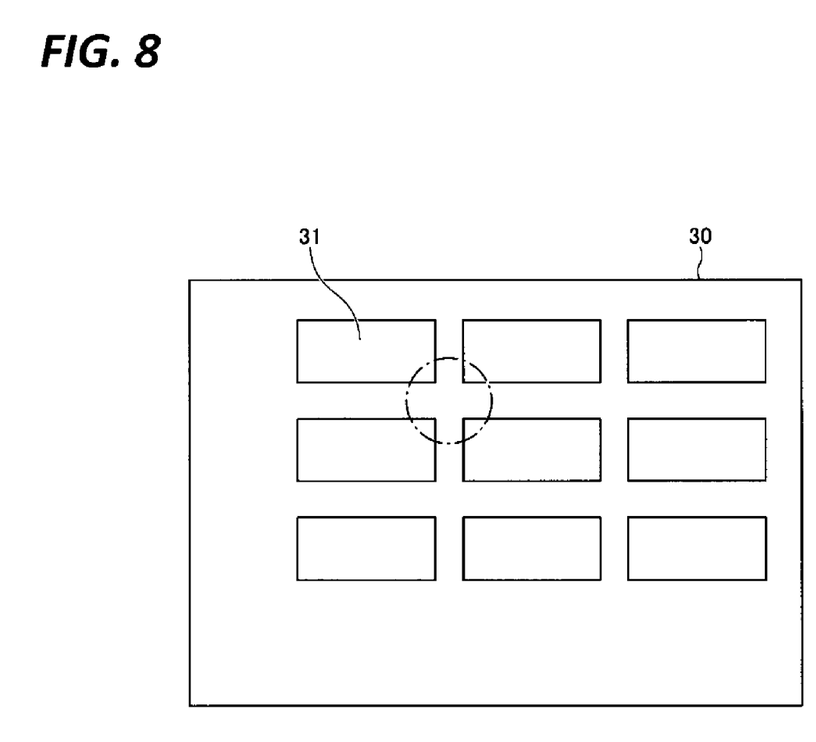
FIG. 8 is a view illustrating an example of an opening of a clean room facility structure.

FIG. 8 is a view illustrating an example of openings 31 of a clean room facility structure 30. The shapes of the pipes 61a to 64a are determined such that the pipes 61a to 64a may pass through the openings 31.

Figure 9A:
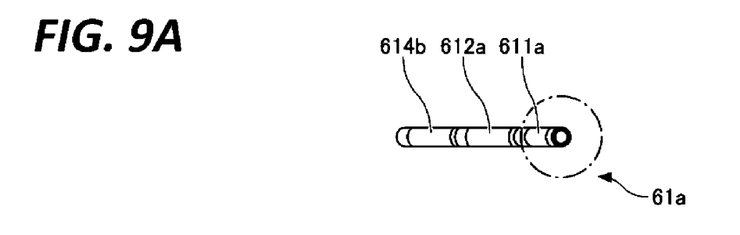
FIGS. 9A and 9B are views illustrating a swing width in a pipe.
Figure 9B:
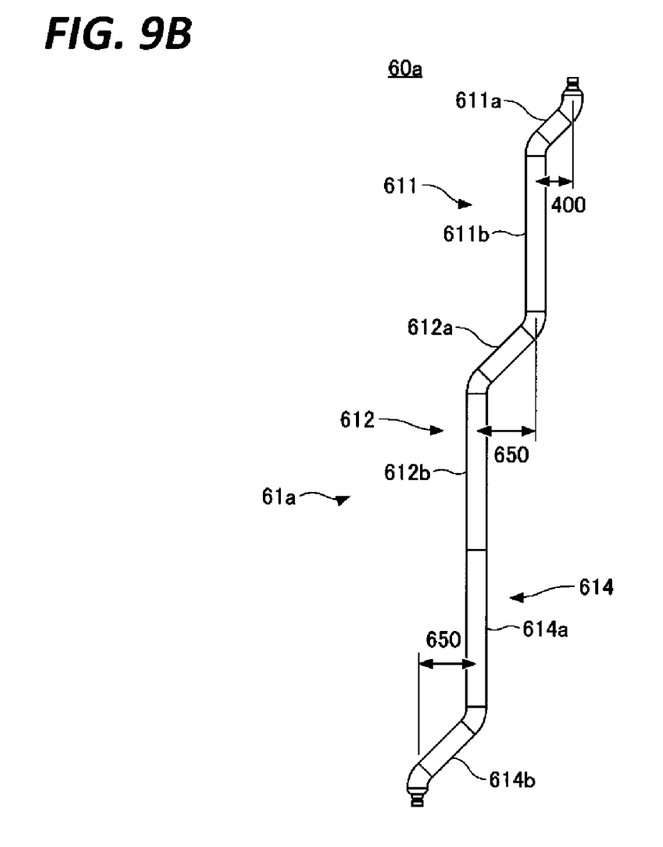

FIGS. 9A and 9B are views illustrating a swing width in the pipe 61a. FIG. 9A is a plan view of the pipe 61a as viewed from above. FIG. 9B is a side view of the pipe 61a as viewed from the side.

As illustrated in FIG. 9A, the lengths protruding to the sides of the inclined portions 611a, 612a, and 614b determine a fluctuation range of the pipe 61a.

FIG. 9B illustrates an example of a method of setting the fluctuation range of the inclined portions 611a, 612a, and 614b. In FIG. 9B, an example is given in which the length of the orthogonal projection of the inclined portion 611a of the partial pipe 611 in the horizontal direction is set to 400 mm, the length of the orthogonal projection of the inclined portion 612a of the partial pipe 612 in the horizontal direction is set to 650 mm, and the length of the orthogonal projection of the inclined portion 614b of the partial pipe 614 in the horizontal direction is set to 650 mm. The fluctuation range of the inclined portion is exactly the length of the orthogonal projection in the horizontal direction, but hereinafter, may be abbreviated as a "fluctuation range."

The uppermost partial pipe 611a of the pipe 61a is a portion through which the opening 31 of the clean room facility structure 30 illustrated in FIG. 8 is passed, and the fluctuation range is also limited by the size of the opening 31. Therefore, the fluctuation range is set as small as 400 mm.

Meanwhile, in the partial pipes 612 and 614, since there is no such restriction on the fluctuation range, a large fluctuation range of 650 mm is set.

With such a setting, in the partial pipe 611, when it is assumed that the opening 31 of the clean room facility structure 30 is simply passed through and the fluctuation width is zero, the route of the pipe 61a may be freely set within the range of 650 mm×2=1300 mm.

In this way, when there are restrictions due to the environment of the room, it is possible to set the restricted portion to a small fluctuation range and the unrestricted portion to a large fluctuation range to secure a sufficient fluctuation range as a whole.

Further, when the inclination angles of the inclined portions 611a, 612a, and 614b are set to be constant, since the fluctuation range is determined by the lengths of the inclined portions 611a, 612a, and 614b, the lengths of the inclined portions 612a and 614b of the partial pipes 612 and 614 are set to be longer than that of the inclined portion 611a of the partial pipe 611.

In this way, the fluctuation range of the partial pipe may be variously set according to the usage. For example, as illustrated in FIGS. 9A and 9B, when there is a restriction on the opening 31 of the clean room facility structure 30, it is possible to reduce the fluctuation range of the inclined portion 611a of the uppermost partial pipe 611 to pass, equally increase the fluctuation ranges of the inclined portion 612a of the second partial pipe 612 and the inclined portion 614b of the third partial pipe 614, and making the shapes of the entire partial pipes 612 and 614 the same, thereby reducing the processing cost. In FIGS. 9A and 9B, such a configuration is illustrated.

When is no such restriction, it is possible to set the fluctuation ranges of the inclined portions 611a, 612a, and 614b of the three partial pipes 611, 612, and 614 to be the same. In this way, the fluctuation ranges may freely set according to the usage.

Figure 10:
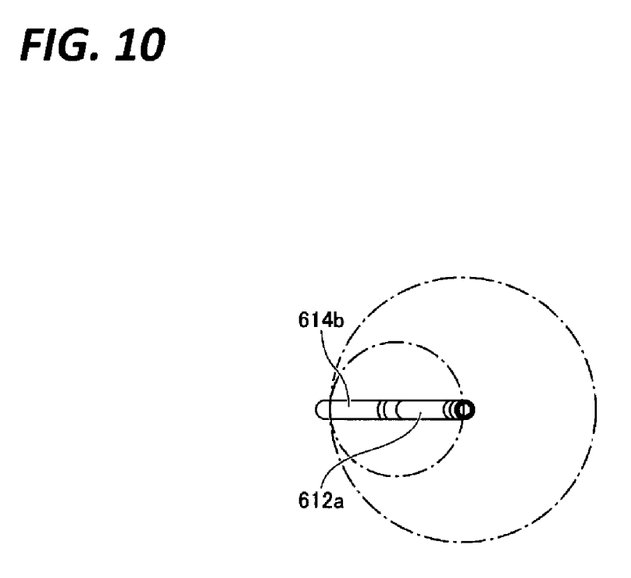
FIG. 10 is a view illustrating a concept of route setting.

FIG. 10 is a view illustrating a concept of route setting. As illustrated in FIG. 10, it is possible to follow an arbitrary route within the circle of the total fluctuation range of the partial pipes 612 and 614 after passing through the openings 31 of the clean room facility structure 30. Therefore, the pipes 61a to 64a may be installed to have the highest space efficiency within the circle.

Figure 11A:
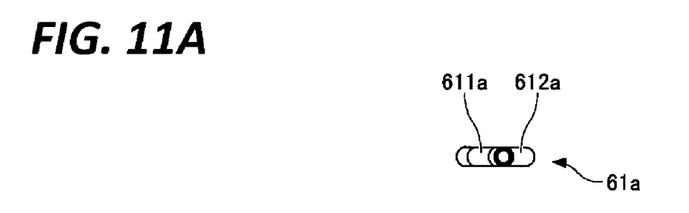
FIGS. 11A and 11B are views illustrating an example of the shape of a pipe in which a fluctuation range is set to be small.
Figure 11B:
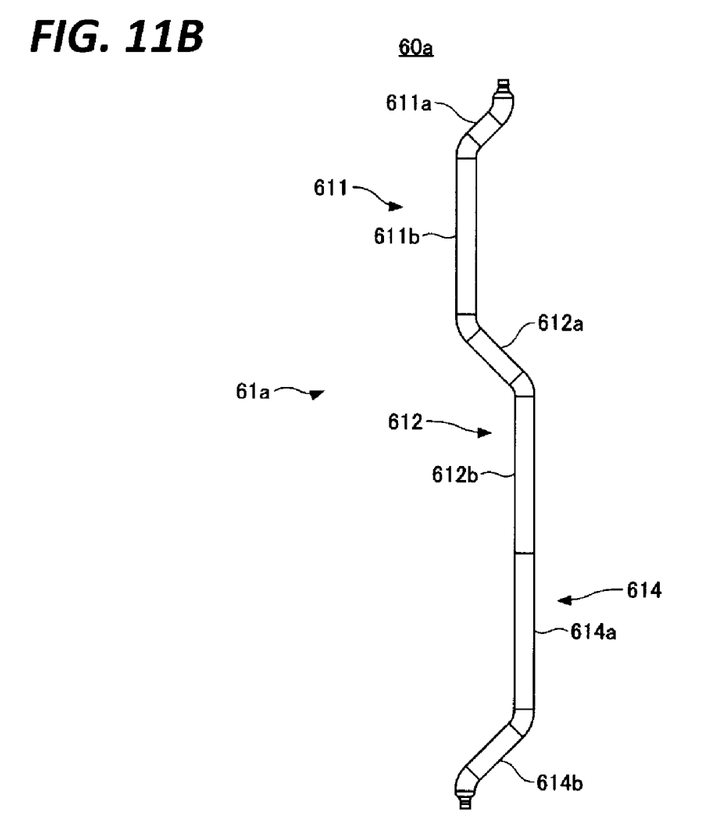

FIGS. 11A and 11B are views illustrating an example of the shape of a pipe 61a in which a fluctuation range is set to be small. As illustrated in FIGS. 11A and 11B, the pipe 61a is shaped such that the portion moved by the partial pipe 612 is returned by the partial pipe 614. When the pipe 61a is set to such a shape, the piping structure 60a having a small fluctuation range may be obtained.

Figure 12A:
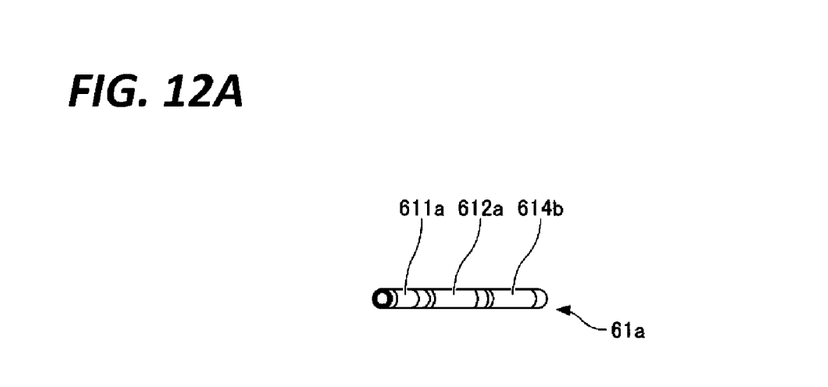
FIGS. 12A and 12B are views illustrating an example of the shape of a pipe in which a fluctuation range is set to be large.
Figure 12B:
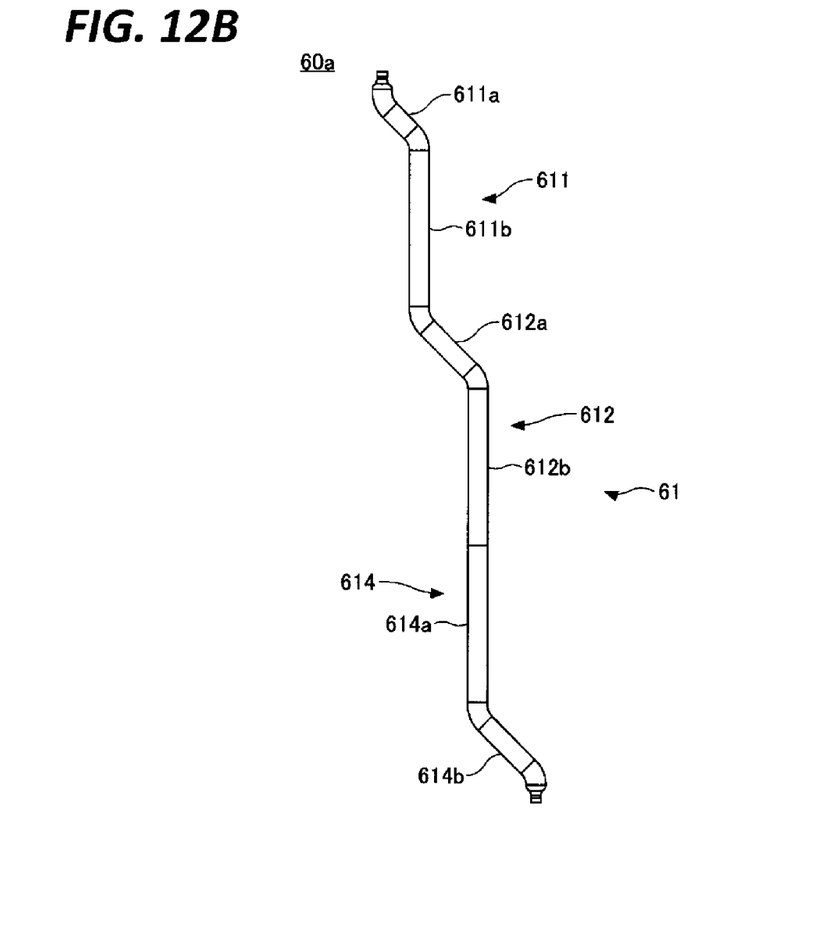

FIGS. 12A and 12B are views illustrating an example of the shape of a pipe 61a in which a fluctuation range is set to be large. As illustrated in FIGS. 12A and 12B, the pipe 61a is shaped to move to the right in the partial pipe 612 and then further to the right in the partial pipe 614. When the pipe 61a is set to such a shape, the piping structure 60a having a large fluctuation range may be obtained.

In this way, the fluctuation range of the pipe 61a may be set variously depending on how the partial pipes 611, 612, and 614 are connected, and the conductance of each pipe 61a to 64a of the piping structure 60a may be set to be constant while dealing with various restrictions.

Further, in the present embodiment, an example of three partial pipes has been described, but two partial pipes may be sufficient depending on the required layout. It is also possible to have four partial pipes. However, considering the ease of connection, the degree of freedom of structure, and the degree of decrease in conductance, it may be said that it is often desirable to have three partial pipes.

Further, the processing apparatus according to the embodiment of the present disclosure may be applied to various process modules for processing while performing a vacuum exhaust, and may be applied to various film forming apparatuses, annealing apparatus, and etching apparatuses.

According to the present disclosure, the conductance of a plurality of pipes may be made the same.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A piping structure comprising:
a plurality of pipes configured to connect a plurality of process modules disposed adjacent to each other at a first room and a plurality of vacuum pumps disposed at a second room below the first room to be corresponding to the plurality of process modules, respectively,
wherein the plurality of pipes are divided into a plurality of regions in a height direction, and the plurality of pipes used for regions in an identical height have an identical shape,
each of the plurality of pipes includes partial pipes provided for each of the plurality of regions in the height direction, respectively, and the partial pipes are connected to each other to constitute each of the plurality of pipes,
each of the partial pipes includes an inclined portion provided to have an inclination and a straight portion extending in a vertical direction,
the straight portions of the plurality of partial pipes are parallel to each other,
the plurality of pipes pass through holes defined in a structure spaced apart from the first room and the second room, respectively, and
in each of the plurality of pipes, a first inclined portion of a first partial pipe and a second inclined portion of a second partial pipe at opposite ends of a first straight portion of the first partial pipe disposed in the hole of the structure have different lengths from each other when viewed from above.

2. The piping structure according to claim 1, wherein a direction of the inclined portion is different for each of the plurality of pipes.

3. The piping structure according to claim 2, wherein each of the plurality of pipes includes three partial pipes.

4. The piping structure according to claim 3, wherein in the three partial pipes, lengths of inclined portions of second and third partial pipes are larger than a length of an inclined portion of an uppermost partial pipe.

5. The piping structure according to claim 4, wherein the second and third partial pipes have an identical shape.

6. A processing apparatus comprising:
a plurality of process modules disposed adjacent to each other at a first room;
a plurality of vacuum pumps disposed in a second room below the first room and provided to be corresponding to the plurality of process modules; and
a plurality of pipes configured to connect the plurality of process modules and the plurality of vacuum pumps, respectively,
wherein the plurality of pipes are divided into a plurality of regions in a height direction, and the plurality of pipes used for regions in an identical height have an identical shape,
each of the plurality of pipes includes partial pipes provided for each of the plurality of regions in the height direction, respectively, and the partial pipes are connected to each other to constitute each of the plurality of pipes,
each of the partial pipes includes an inclined portion provided to have an inclination and a straight portion extending in a vertical direction,
the straight portions of the plurality of partial pipes are parallel to each other,
the plurality of pipes pass through holes defined in a structure spaced apart from the first room and the second room, respectively, and
in each of the plurality of pipes, a first inclined portion of a first partial pipe and a second inclined portion of a second partial pipe at opposite ends of a first straight portion of the first partial pipe disposed in the hole of the structure have different lengths from each other when viewed from above.

7. The processing apparatus according to claim 6, wherein a direction of the inclined portion is different for each of the plurality of pipes.

8. The processing apparatus according to claim 7, wherein each of the plurality of pipes includes three partial pipes.

9. The processing apparatus according to claim 8, wherein in the three partial pipes, lengths of inclined portions of second and third partial pipes are larger than a length of an inclined portion of an uppermost partial pipe.

10. The processing apparatus according to claim 9, wherein the second and third partial pipes have an identical shape.

11. The processing apparatus according to claim 6, wherein each of the plurality of process modules is configured to process a substrate, and
the structure between the first room and the second room is a clean room facility structure.

* * * * *